(12) United States Patent
Fujimura et al.

(10) Patent No.: US 8,745,549 B2
(45) Date of Patent: Jun. 3, 2014

(54) METHOD AND SYSTEM FOR FORMING HIGH PRECISION PATTERNS USING CHARGED PARTICLE BEAM LITHOGRAPHY

(75) Inventors: Akira Fujimura, Saratoga, CA (US); Robert C. Pack, Morgan Hill, CA (US)

(73) Assignee: D2S, Inc., San Jose, CA (US)

( * ) Notice: Subject to any disclaimer, the term of this patent is extended or adjusted under 35 U.S.C. 154(b) by 0 days.

(21) Appl. No.: 13/366,335

(22) Filed: Feb. 5, 2012

(65) Prior Publication Data

US 2013/0205264 A1 Aug. 8, 2013

(51) Int. Cl.
*G06F 17/50* (2006.01)

(52) U.S. Cl.
USPC .......... 716/53; 716/50; 716/51; 716/52; 716/54; 716/55; 430/5; 430/30

(58) Field of Classification Search
CPC . G07F 17/50; G07F 17/5009; G07F 17/5045; G07F 17/5077; G03F 1/36; G03F 1/70; G03F 7/2063; G03F 7/70441; G03F 7/70991; B82Y 10/00; B82Y 40/00
USPC .................. 716/50–55; 430/5, 30
See application file for complete search history.

(56) References Cited

U.S. PATENT DOCUMENTS

| | | | | |
|---|---|---|---|---|
| 6,066,854 | A * | 5/2000 | Tamura | 250/492.22 |
| 7,588,869 | B2 * | 9/2009 | Lee et al. | 430/22 |
| 7,754,401 | B2 * | 7/2010 | Fujimura et al. | 430/30 |
| 7,759,027 | B2 | 7/2010 | Fujimura et al. | |
| 8,017,288 | B2 | 9/2011 | Fujimura et al. | |
| 8,039,176 | B2 | 10/2011 | Fujimura et al. | |
| 8,137,871 | B2 | 3/2012 | Zable et al. | |
| 8,458,624 | B2 * | 6/2013 | Choi et al. | 716/52 |
| 2010/0072390 | A1 * | 3/2010 | Yashima | 250/396 R |
| 2012/0094219 | A1 | 4/2012 | Fujimura et al. | |

* cited by examiner

*Primary Examiner* — Nghia Doan
(74) *Attorney, Agent, or Firm* — The Mueller Law Office, P.C.

(57) ABSTRACT

A method for fracturing or mask data preparation or proximity effect correction or optical proximity correction or mask process correction is disclosed in which a set of charged particle beam shots is determined that is capable of forming a pattern on a surface, wherein critical dimension (CD) split is reduced through the use of overlapping shots.

27 Claims, 8 Drawing Sheets

METHOD AND SYSTEM FOR FORMING HIGH PRECISION PATTERNS USING CHARGED PARTICLE BEAM LITHOGRAPHY

BACKGROUND OF THE DISCLOSURE

The present disclosure is related to lithography, and more particularly to the design and manufacture of a surface which may be a reticle, a wafer, or any other surface, using charged particle beam lithography.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks or even other reticles. While conventional optical lithography uses a light source having a wavelength of 193 nm, extreme ultra-violet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nanoimprint lithography, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Also, some patterns of a given layer may be written using optical lithography, and other patterns written using maskless direct write. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of designed features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a designed feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a designed feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the designed features on the mask. As process nodes continue to shrink, the size of the smallest SRAFs on a photomask also shrinks For example, at the 20 nm logic process node, 40 nm to 60 nm SRAFs are needed on the mask for the highest precision layers.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

There are a number of technologies used for forming patterns on a reticle, including using optical lithography or charged particle beam lithography. The most commonly used system is the variable shaped beam (VSB), where, as described above, doses of electrons with simple shapes such as manhattan rectangles and 45-degree right triangles expose a resist-coated reticle surface. In conventional mask writing, the doses or shots of electrons are conventionally designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

In EUV lithography, OPC features are generally not required. Therefore, the complexity of the pattern to be manufactured on the reticle is less than with conventional 193 nm wavelength optical lithography, and shot count reduction is correspondingly less important. In EUV, however, mask accuracy requirements are very high because the patterns on the mask, which are typically 4× the size of the patterns on the wafer, are sufficiently small that they are challenging to form precisely using charged particle beam technology such as electron beam.

SUMMARY OF THE DISCLOSURE

A method for fracturing or mask data preparation or proximity effect correction or optical proximity correction or mask process correction is disclosed in which a set of charged particle beam shots is determined that is capable of forming a pattern on a surface, wherein critical dimension (CD) split is reduced through the use of overlapping shots.

Additionally, a method for fracturing or mask data preparation or proximity effect correction or optical proximity correction or mask process correction is disclosed, in which a set of charged particle beam shots is determined for one or more exposure passes, where CD variation caused by CD split is reduced through the use of overlapping shots, and where the union of shots for any exposure pass is different than the union of shots for all exposure passes combined

DETAILED DESCRIPTION OF THE EMBODIMENTS

The present disclosure describes a method for fracturing patterns into shots for a charged particle beam writer, where overlapping shots are generated to improve the critical dimension (CD) uniformity of the pattern written to the surface by reducing the CD split and the effects of CD split.

Figure 1:
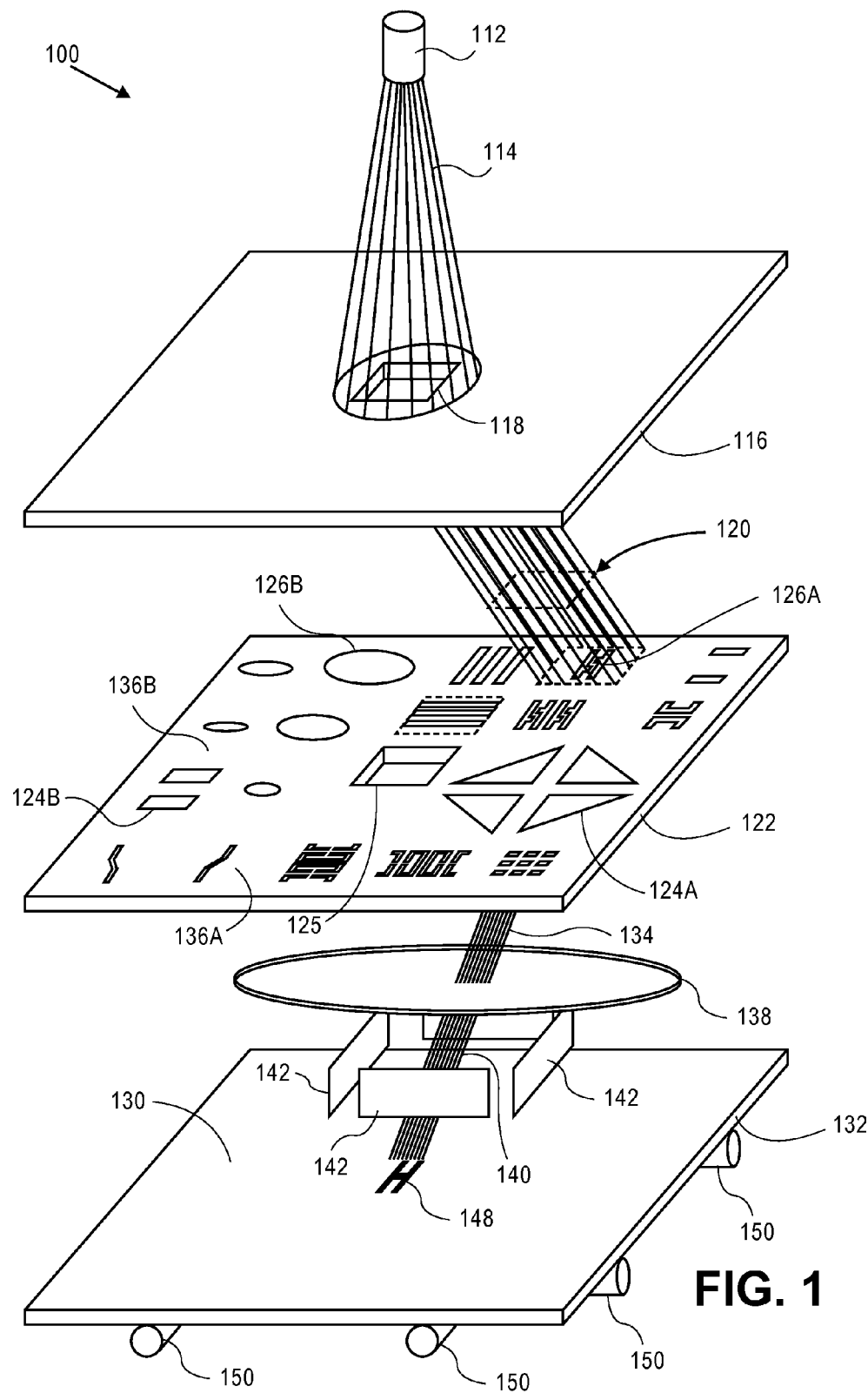
FIG. 1 illustrates an example of a character projection particle beam system.

Referring now to the drawings, wherein like numbers refer to like items, FIG. 1 illustrates an embodiment of a conventional lithography system 100, such as a charged particle beam writer system, in this case an electron beam writer system, that employs character projection to manufacture a surface 130. The electron beam writer system 100 has an electron beam source 112 that projects an electron beam 114 toward an aperture plate 116. The plate 116 has an aperture 118 formed therein which allows the electron beam 114 to pass. Once the electron beam 114 passes through the aperture 118 it is directed or deflected by a system of lenses (not shown) as electron beam 120 toward another rectangular aperture plate or stencil mask 122. The stencil 122 has formed therein a number of openings or apertures 124 that define various types of characters 126, which may be complex characters. Each character 126 formed in the stencil 122 may be used to form a pattern 148 on a surface 130 of a substrate 132, such as a silicon wafer, a reticle or other substrate. In partial exposure, partial projection, partial character projection, or variable character projection, electron beam 120 may be positioned so as to strike or illuminate only a portion of one of the characters 126, thereby forming a pattern 148 that is a subset of character 126. For each character 126 that is smaller than the size of the electron beam 120 defined by aperture 118, a blanking area 136, containing no aperture, is designed to be adjacent to the character 126, so as to prevent the electron beam 120 from illuminating an unwanted character on stencil 122. An electron beam 134 emerges from one of the characters 126 and passes through an electromagnetic or electrostatic reduction lens 138 which reduces the size of the pattern from the character 126. In commonly available charged particle beam writer systems, the reduction factor is between 10 and 60. The reduced electron beam 140 emerges from the reduction lens 138, and is directed by a series of deflectors 142 onto the surface 130 as the pattern 148, which is depicted as being in the shape of the letter "H" corresponding to character 126A. The pattern 148 is reduced in size compared to the character 126A because of the reduction lens 138. The pattern 148 is drawn by using one shot of the electron beam system 100. This reduces the overall writing time to complete the pattern 148 as compared to using a variable shape beam (VSB) projection system or method. Although one aperture 118 is shown being formed in the plate 116, it is possible that there may be more than one aperture in the plate 116. Although two plates 116 and 122 are shown in this example, there may be only one plate or more than two plates, each plate comprising one or more apertures. Stencil mask 122 also contains apertures for VSB shots, such as rectangular aperture 125.

In conventional charged particle beam writer systems the reduction lens 138 is calibrated to provide a fixed reduction factor. The reduction lens 138 and/or the deflectors 142 also focus the beam on the plane of the surface 130. The size of the surface 130 may be significantly larger than the maximum beam deflection capability of the deflection plates 142. Because of this, patterns are normally written on the surface in a series of stripes. Each stripe contains a plurality of sub-fields, where a sub-field is within the beam deflection capability of the deflection plates 142. The electron beam writer system 100 contains a positioning mechanism 150 to allow positioning the substrate 132 for each of the stripes and sub-fields. In one variation of the conventional charged particle beam writer system, the substrate 132 is held stationary while a sub-field is exposed, after which the positioning mechanism 150 moves the substrate 132 to the next sub-field position. In another variation of the conventional charged particle beam writer system, the substrate 132 moves continuously during the writing process. In this variation involving continuous movement, in addition to deflection plates 142, there may be another set of deflection plates (not shown) to move the beam at the same speed and direction as the substrate 132 is moved. In one embodiment the substrate 132 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 148, generally reduced in size, onto a silicon wafer to produce an integrated circuit. More generally, the mask is used in another device or machine to transfer the pattern 148 on to a substrate. In another embodiment the substrate 132 may be a silicon wafer.

The minimum size pattern that can be projected with reasonable accuracy onto a surface 130 is limited by a variety of short-range physical effects associated with the electron beam writer system 100 and with the surface 130, which normally comprises a resist coating on the substrate 132. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation.

The shot dosage of a charged particle beam writer such as an electron beam writer system is a function of the intensity of the beam source 112 and the exposure time for each shot. Typically the beam intensity remains fixed, and the exposure time is varied to obtain variable shot dosages. The exposure time may be varied to compensate for various long-range effects such as backscatter and fogging in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels. Some embodiments of the current invention are targeted for use with charged particle beam writing systems which allow assignment of one of a relatively few dosage levels.

The mechanisms within electron beam writers have a relatively coarse resolution for calculations. As such, mid-range corrections such as may be required for EUV masks in the range of 2 μm cannot be computed accurately by current electron beam writers.

In exposing, for example, a repeated pattern on a surface using charged particle beam lithography, the size of each pattern instance, as measured on the final manufactured surface, will be slightly different, due to manufacturing variations. The amount of the size variation is an essential manufacturing optimization criterion. In current mask masking, a root mean square (RMS) variation of no more than 1 nm (1 sigma) in pattern size may be desired. More size variation translates to more variation in circuit performance, leading to higher design margins being required, making it increasingly difficult to design faster, lower-power integrated circuits. This variation is referred to as critical dimension (CD) variation. A low CD variation is desirable, and indicates that manufacturing variations will produce relatively small size variations on the final manufactured surface. In the smaller scale, the effects of a high CD variation may be observed as line edge roughness (LER). LER is caused by each part of a line edge being slightly differently manufactured, leading to some waviness in a line that is intended to have a straight edge. CD variation is, among other things, inversely related to the slope of the dosage curve at the resist threshold, which is called edge slope. Therefore, edge slope, or dose margin, is a critical optimization factor for particle beam writing of surfaces. In this disclosure, edge slope and dose margin are terms that are used interchangeably. It should be noted that dose margin is a way to model multiple distinct sources of manufacturing variation—not just variation in the dosage. Beam current, beam dosage, resist thickness, and resist sensitivity are among the sources of manufacturing variation that can be bundled into dose margin. In addition, size variation may also be bundled into dose margin for certain types of analyses.

Figure 2A:
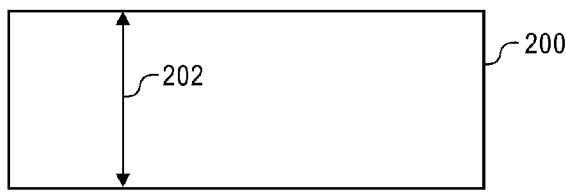
FIG. 2A illustrates an example of a rectangular pattern.
Figure 2B:
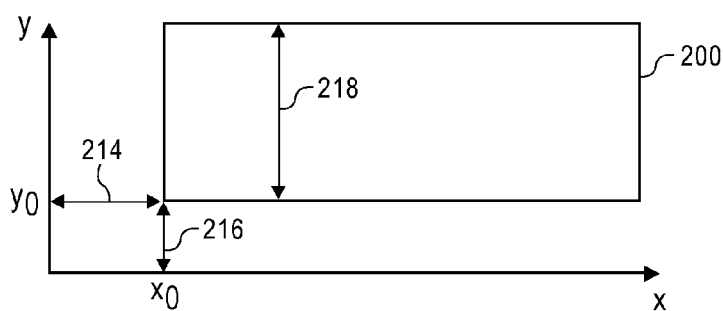
FIG. 2B illustrates an example of a single rectangular VSB shot that can form pattern of FIG. 2A.
Figure 2C:
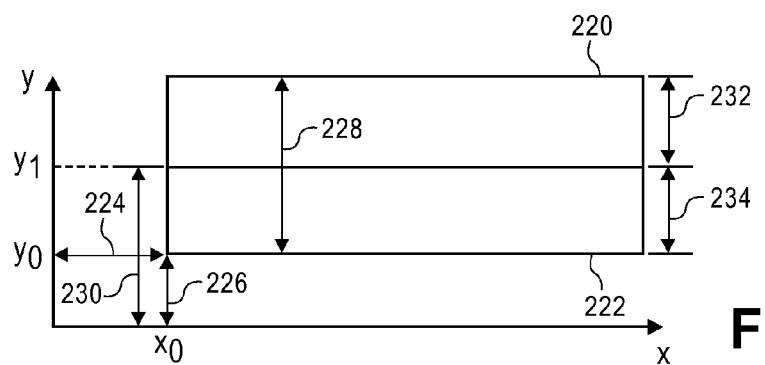
FIG. 2C illustrates an example of a pair of rectangular VSB shots that can form the rectangular pattern of FIG. 2A.

The normal manufacturing tolerances characteristic of any charged particle beam writer affect CD variation. For VSB, for example, variation in the shape of the beam will cause CD variation of the pattern on the surface. For both VSB and character projection, inaccuracies in the positioning of the particle beam on the surface will cause pattern inaccuracies which may or may not affect CD variation. This is illustrated in FIG. 2A-D. FIG. 2A illustrates a pattern 200 which is desired to be formed on a surface. The critical dimension of pattern 200 is its size in the y-dimension 202. FIG. 2B illustrates how pattern 200 may be formed on a surface using a single VSB shot 210. With respect to a Cartesian coordinate axis, the position of shot 210, as represented by its lower-left corner, is at position $x_0$, $y_0$, where $x_0$ is distance 214 from the y-axis and $y_0$ is distance 216 from the x-axis. The y-size of the shot is 218. Variation in y-size 218 will affect the critical dimension. However, variation in shot position, either in the x-dimension illustrated by distance 214, or in the y-dimension illustrated by distance 216, does not affect y-size 218, and therefore does not increase CD variation of the resulting pattern on the surface. FIG. 2C illustrates an example of how pattern 200 may be formed on the surface using two shots, as illustrated by shot 220 and shot 222. The position of shot 222 as represented by its lower-left corner is $x_0$, $y_0$. The position of shot 220 is $x_0$, $y_1$. Shot 220 has a y-dimensional size 232 and shot 222 has a y-dimensional size of 234. Shots 220 and 222 are intended to abut, so that the sum 228 of the y-dimensional sizes 232 and 234 equals y-dimension 202. In the example of FIG. 2C positional variation of either shot in the x-dimension can affect the distance 224 of either shot 220 or 222 from the y-axis. The x-dimensional variation does not affect distance 228, and so does not increase CD variation of the resulting pattern on the surface. However, positional variation of either shot 220 or 222 in the y-direction, causing a change in distance 226 of shot 222 from the x-axis, or a change in distance 230 of shot 220 from the x-axis, may affect distance 228, and therefore the CD of the resulting pattern. Specifically, if both shots 222 and 220 have a y-position variation, where $$y_{shot\ 222} = y_0 + \Delta y_0 \text{ where } \Delta y_0 \text{ is the variation for shot } 222$$

and $$y_{shot\ 220} = y_1 + \Delta y_1 \text{ where } \Delta y_1 \text{ is the variation for shot } 220$$

then the distance 228 will change by the amount $\Delta y_1 - \Delta y_0$, which is the difference in the variation between shot 220 and shot 222. The CD of the resulting pattern on the surface will change by this amount. When a CD such as y-size 228 is determined by a plurality of shots such as shot 220 and 222, the shot configuration is called a CD split. No CD split exists in FIG. 2B because y-size 218 is determined only by shot 210. FIG. 2C therefore illustrates how a CD split can increase CD variation, compared to FIG. 2B in which no CD split exists. Conventional fracturing avoids CD split as much as possible, so as to improve CD variation.

Figure 2D:
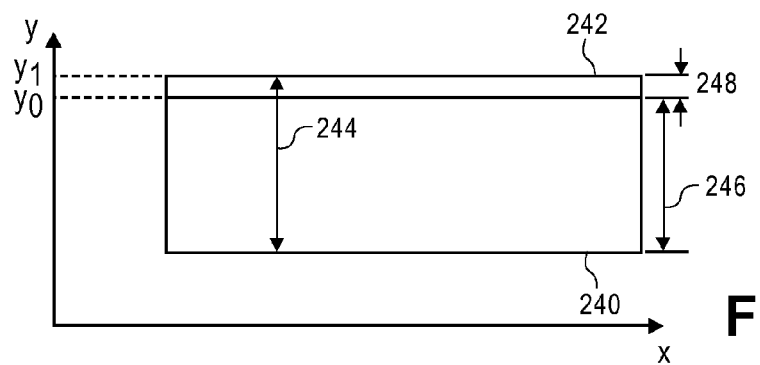
FIG. 2D illustrates another example of a pair of rectangular VSB shots that can form the rectangular pattern of FIG. 2A.

CD split is a matter of degree. FIG. 2D illustrates another example of how pattern 200 can be formed on a surface with two shots, including shot 240 and shot 242. The y-dimension of shot 240 is distance 246. The y-dimension of shot 242 is distance 248. Shots 240 and 242 together have a y-dimensional size of 244, which equals 202. Shot 242 is called a sliver because, as can be seen, its y-dimensional size is quite small. In fracturing, sliver shots are generally avoided for reasons unrelated to CD split. However, the pair of shots 240 and 242 will desirably cause less CD variation in the y-dimension of the formed pattern than, for example pair of shots 220 and 222. This is due to the fact that the finite edge slope of the dosage curve of shot 240 at the $y=y_0$ shot edge causes shot 240 sub-threshold dosage above $y=y_0$ to affect the $y=y_1$ pattern edge, due to the small width 248 of shot 242, thereby reducing the influence of positional variation of shot 242 with respect to shot 240. By contrast, in pairs of shots 220 and 222, the y-sizes 232 and 234 are sufficiently large that the $y=y_0$ edge of shot 222, for example, receives very little dosage from far-away shot 220, and therefore CD variation caused by y-position variation of shot 222 is not reduced by dosage from shot 220.

A CD split will also cause less CD variation when the shot is less than a normal dosage, such as when multi-pass exposure is used, or when the dose modulation is being used, such as with model-based fracturing.

CD split may also cause CD variation due to rotational variation in the charged particle beam writer.

Figure 3A:
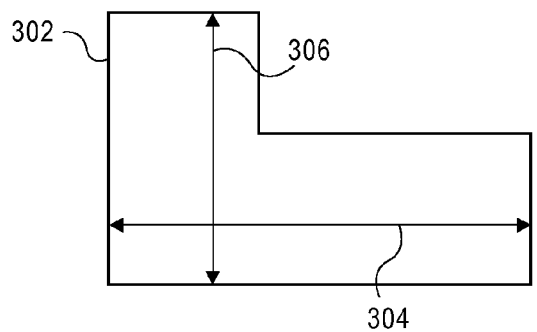
FIG. 3A illustrates an example of a pattern for which CD split cannot be avoided.
Figure 3B:
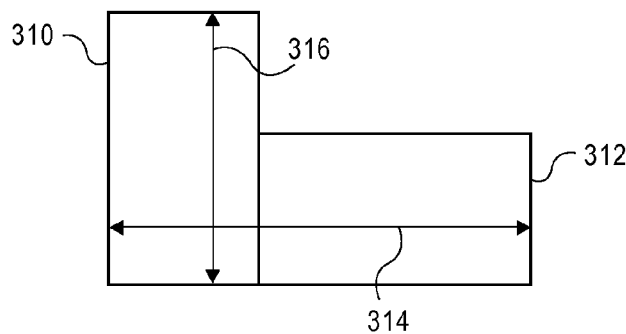
FIG. 3B illustrates an example of how the pattern of FIG. 3A can be fractured into two VSB shots.
Figure 3C:
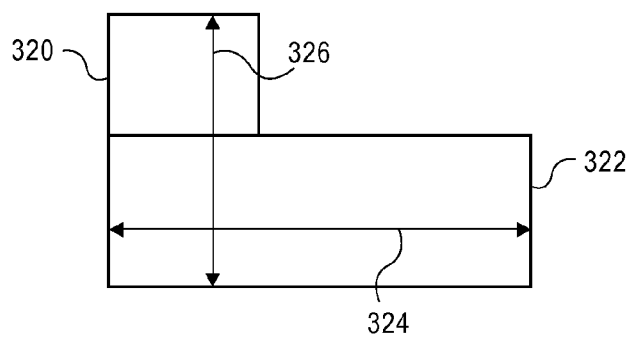
FIG. 3C illustrates another example of how the pattern of FIG. 3A can be fractured into two VSB shots.

FIG. 3A illustrates an L-shaped pattern 302. For pattern 302, both x-dimension 304 and y-dimension 306 are critical dimensions. FIG. 3B illustrates one method of fracturing pattern 302. In FIG. 3B two VSB shots, including shot 310 and shot 312, are used to form pattern 302. As can be seen, the y-dimension 316 is determined only by shot 310. Positional error of either shot 310 or shot 312 will not affect y-dimension 316, as is explained above. However, the x-dimension 314 is determined by both shots 310 and 312, thereby creating a CD split. Positional error of either of shots 310 or 312 relative to each other will cause variation in the x-dimension 314, for the reasons described above in FIG. 2C. FIG. 3C illustrates a different set of shots, consisting of shot 320 and shot 322, that can form the pattern 302. As can be seen, the x-dimension 324 in FIG. 3C, which corresponds to x-dimension 314 in FIG. 3B, is determined by the single shot 322, thereby avoiding CD split. However, the y-dimension 326 is determined by a both shots 320 and 322, thereby creating a CD split for y-dimension 326. Pattern 302 is an example of a pattern that, if fractured with VSB shots, will result in a CD split for at least one dimension. For patterns where CD split cannot be entirely avoided, shots can be determined so that CD split is avoided in the more critical dimension of the pattern. For example, if x-dimension 324 is more critical than y-dimension 326, then shots 320 and 322 is the preferred shot configuration compared to shots 310 and 312.

Character projection can be used to reduce the effects of CD split in cases where CD split cannot be avoided using VSB shots. In FIG. 3A, pattern 302 can be formed using a single shot if a CP character with the shape of pattern 302 exists on the stencil. Character projection is therefore one method of avoiding CD split in more complex patterns.

The effects of CD split can be reduced with the use of multi-pass exposure, including conventional multi-pass exposure. For example, if two exposure passes are used, with the same set of shots—including the same dosages—for each pass, a random shot positional variation will affect CD variation only one-half as much as when using a single exposure pass, since only one-half of the total dosage is delivered in each exposure pass. U.S. patent application Ser. No. 12/647,453, "Method and System for Fracturing a Pattern Using Charged Particle Beam Lithography with Multiple Exposure Passes which Expose Different Surface Area," which is owned by the assignee of the current application and which is hereby incorporated by reference for all purposes, discloses a different multi-pass exposure technique, in which the sets of shots for different exposure passes are different, and where the union of shots for any exposure pass is different than the union of shots for all exposures passes. Since some positional variation may correlate with shot size and position, even greater CD variation improvement may be achieved with the multi-pass technique disclosed in U.S. patent application Ser. No. 12/647,453.

Figure 3D:
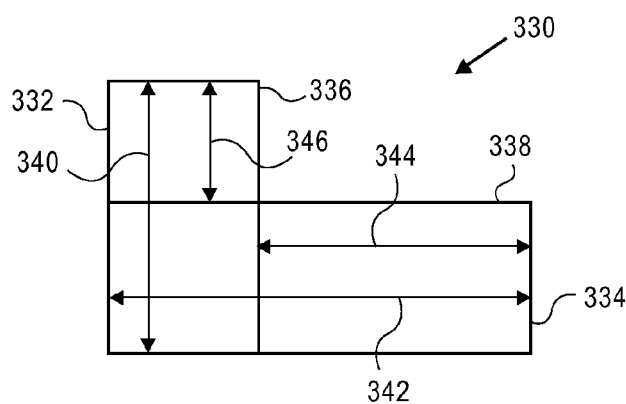
FIG. 3D illustrates an example of how the pattern of FIG. 3A can be fractured into two VSB shots in each of two exposure passes.

FIG. 3D illustrates a method of reducing the effects of CD split using multiple exposure passes, according to another embodiment of the current disclosure. The set of shots 330 consists of four shots, including two shots in each of two exposure passes. The first exposure pass consists of shot 332 and shot 334, which overlap each other. Shot 332 has y-dimension 340 and shot 334 has x-dimension 342. The second exposure pass consists of shot 336 and shot 338. Shot 336 has y-dimension 346 and shot 338 has x-dimension 344. All edges of the pattern formed by the set of shots 330 are formed by exposure from two shots, thereby reducing by half the effects of manufacturing variation for each shot.

Figure 4A:
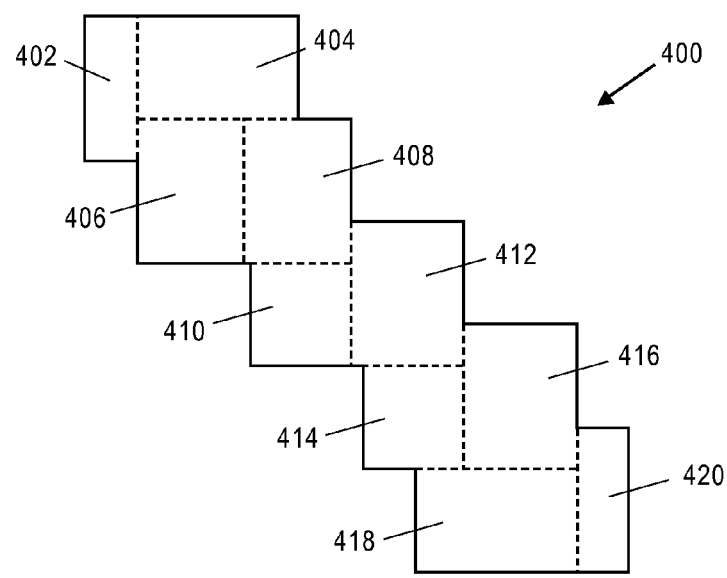
FIG. 4A illustrates an example of a set of shots which can form a diagonal path or track.
Figure 4B:
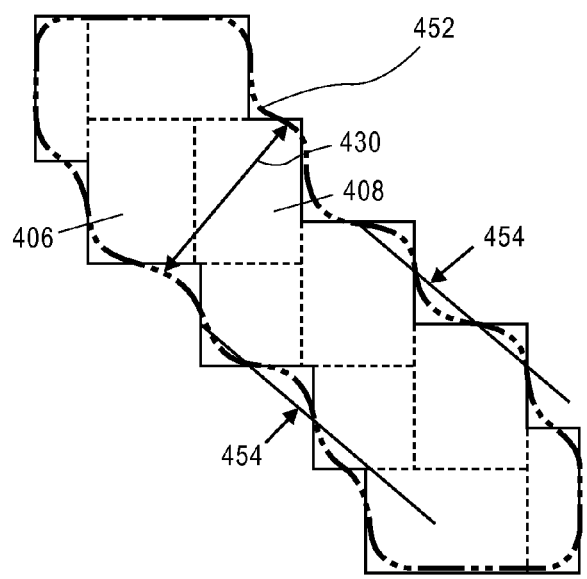
FIG. 4B illustrates an example of a pattern which may be formed on a surface from the set of shots from FIG. 4A.

FIG. 4A illustrates an example of a set of conventional non-overlapping VSB shots 400 that will form a diagonal path or track. The set of shots 400 consists of shot 402, shot 404, shot 406, shot 408, shot 410, shot 412, shot 414, shot 416, shot 418, and shot 420. The shots abut but do not overlap neighboring shots. FIG. 4B illustrates a pattern 452 that the set of shots 400 may form on a surface. Pattern 452 is illustrated as a heavy broken line. Charged particle beam simulation may be used to calculate path 452 from set of shots 400. As can be seen, pattern 452 exhibits corner rounding. The CD of pattern 452 is its perpendicular width—that is the dimension in the direction perpendicular to the longest dimension of the path. As commonly measured, the CD of a varying width pattern such as pattern 452 is considered to be its average dimension 454. As can be seen, the perpendicular width of path 452 is nowhere determined by a single shot. For example, along line 430 shots 406 and 408 determine the CD, thereby creating a CD split along line 430. Path 452 is therefore subject to the effects of CD split along its entire length.

Figure 5:
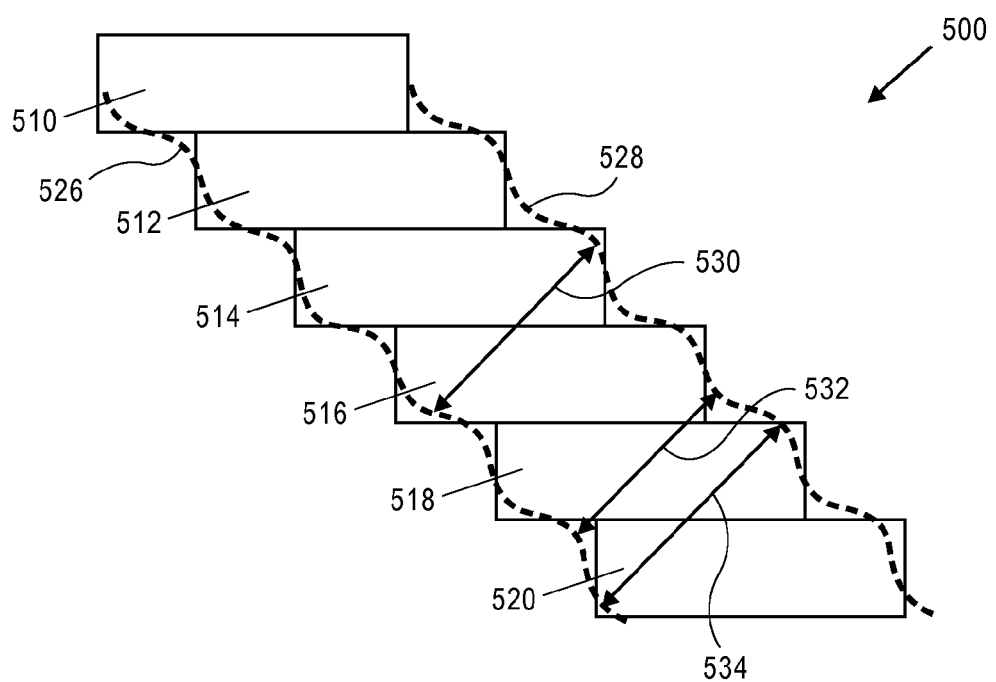
FIG. 5 illustrates an example of a set of non-overlapping VSB shots that can form a diagonal path or track.

FIG. 5 illustrates another example of a set of conventional non-overlapping VSB shots 500 that form a portion of a diagonal path or track. Set of shots 500 includes shot 510, shot 512, shot 514, shot 516, shot 518 and shot 520. The edges of the pattern formed on the surface by set of shots 500 are illustrated as edge 526 and edge 528. As in FIG. 4B, the CD of the pattern formed with edges 526 and 528 is the average dimension perpendicular to the longest dimension of the path or track. The edges 526 and 528 are formed with a CD split along their entire illustrated length. For example, at the position of width 530, the edges 526 and 528 are formed by shots 514 and 516. The CD variation of the path formed by set of shots 500 is therefore affected by the positional error of all shots in set of shots 500. Line width roughness (LWR) is the difference in width between the maximum width of a varying-width path and the minimum width of the path. In FIG. 5, the maximum width is illustrated as distance 534, and minimum width as distance 532. The LWR of the path formed by edges 526 and 528 is the difference between distance 534 and distance 532.

CD split cannot be avoided when forming non-manhattan paths using conventional non-overlapping VSB shots, as illustrated in FIG. 5. In the current invention, shot overlap is used to reduce the effects of CD split.

Figure 6:
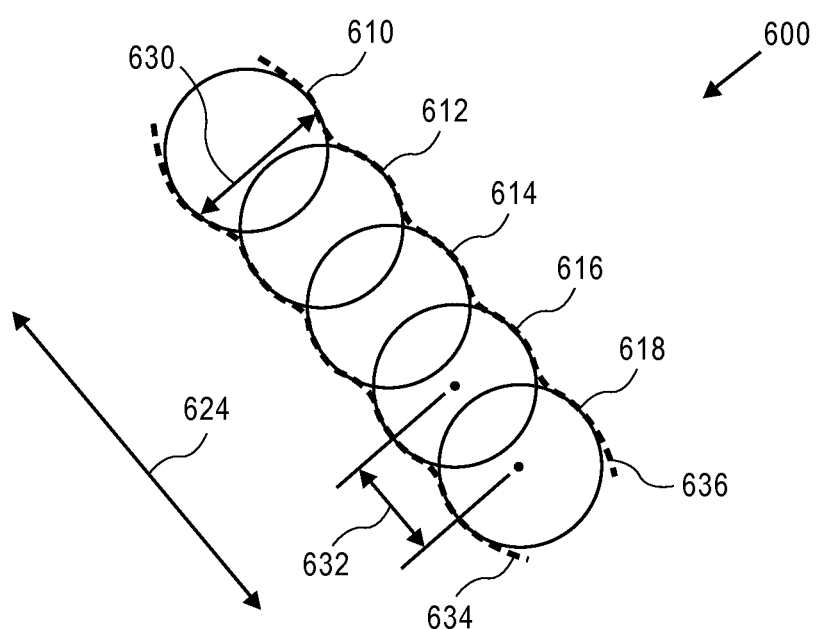
FIG. 6 illustrates an example of a set of overlapping circular character projection shots that can form a diagonal path or track.

FIG. 6 illustrates an embodiment of the present disclosure, in which a set of five overlapping shots of a circular CP character form a path or track. Set of shots 600 consists of shot 610, shot 612, shot 614, shot 616, and shot 618. The center-to-center spacing 632 between shots is the same for each pair of nearest-neighboring shots. Set of shots 600 will form a linear non-manhattan path or track on a surface of direction 624. The edges of the path are illustrated using dotted lines as edge 634 and edge 636. Line segment 630 is in a direction perpendicular to the direction of the path 624. As can be seen, the outline of shot 610 forms both endpoints of line segment 630. For any line segment similar to segment 630, where the line segment is perpendicular to the path direction, both endpoints of the line segment will lie on the outline of the same shot in set of shots 600, thereby reducing the effects of CD split. Paths of any direction which are formed using a plurality of circular shots reduce the effects of CD split through the use of the circular shots. In set of shots 600, the amount of shot overlap, determined by the nearest-neighbor shot spacing 632, determines the line width roughness (LWR) of the exposed path on the surface. A nearest-neighbor shot spacing larger than spacing 632, for example, will increase the LWR of the resulting pattern on the surface. Given a predetermined maximum-allowable LWR for the path on the surface, a shot spacing which produces that maximum-allowable LWR will result in a minimum shot count.

Figure 7A:
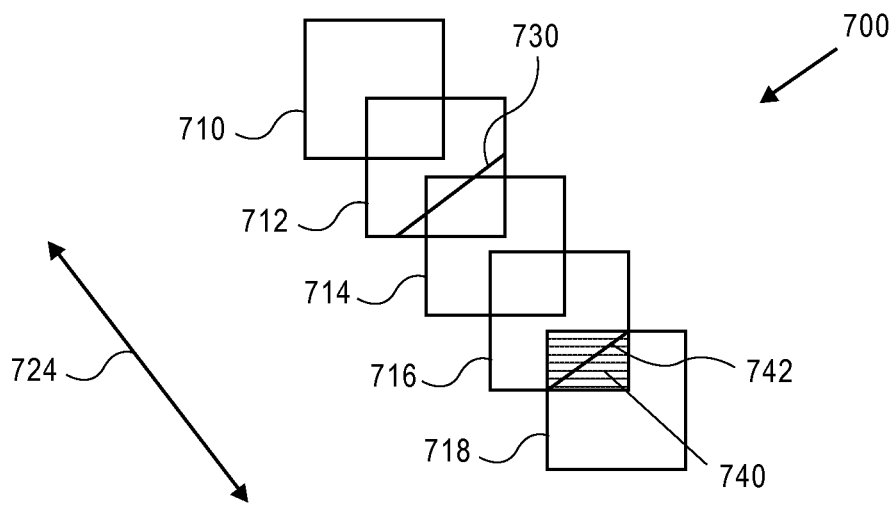
FIG. 7A illustrates an example of a set of overlapping VSB shots that can form a diagonal path or track.

FIG. 7A illustrates an example of a set shots 700 which consists of five overlapping VSB shots that will form a linear non-manhattan track on a surface, according to another embodiment of the current disclosure. Set of shots 700 consists of shot 710, shot 712, shot 714, shot 716 and shot 718. All shots in set of shots 700 are of the same size. Additionally, the x-offset and y-offset of nearest-neighboring shots is uniform, creating uniform overlap between neighboring shots. Set of shots 700 forms a path or track which has a direction 724. Line segment 730, which is in a direction perpendicular to path direction 724, has both its endpoints on the outline of shot 712. Similarly, for any line perpendicular to path direction 724 that intersects set of shots 700, the outer-most pairs of intersections will be with a single shot, such as with line segment 730, or will be at an intersection of two shots, such as with line segment 742. CD split is thus reduced compared to, for example, set of shots 500. CD split can be minimized when the area intersection between pairs of nearest-neighboring shots—a rectangular region—has a diagonal which is perpendicular to the direction of the path. This is illustrated by region 740, which has a diagonal bisector 742 that is perpendicular to the direction of the path 724. The CD split of set of shots 700 is reduced compared to using conventional non-overlapping shots, and also compared to overlapped shots when the area of overlap between nearest-neighboring shots defines a rectangle which has a diagonal that is not perpendicular or almost perpendicular to the direction of the path formed by the set of shots.

Figure 7B:
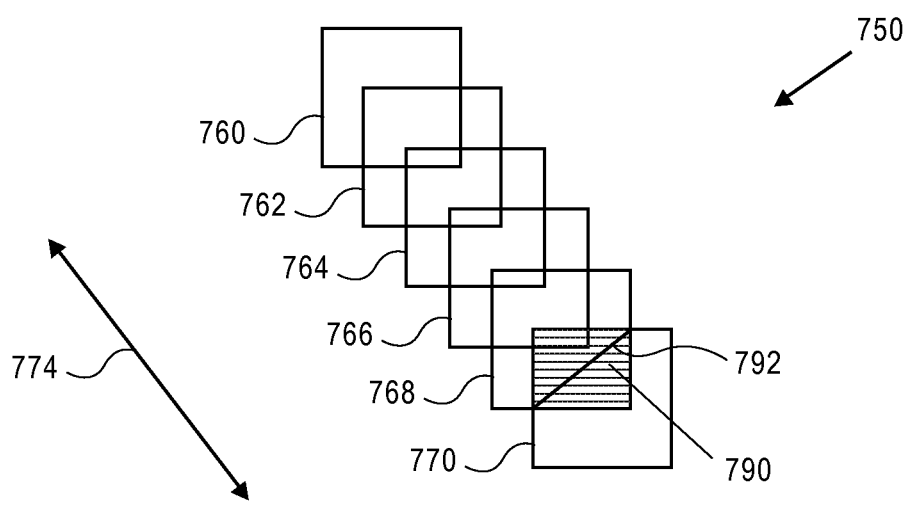
FIG. 7B illustrates another example of a set of overlapping VSB shots that can form a diagonal path or track.

FIG. 7B illustrates an example of a set of six overlapping VSB shots 750. Set of shots 750 consists of shot 760, shot 762, shot 764, shot 766, shot 768 and shot 770. All shots in set of shots 750 are the same size as the shots in set of shot 700. The x-offset and y-offset of nearest-neighboring shots in set of shots 750 is uniform, creating uniform overlap between neighboring shots. Set of shots 750 forms a path or track which has a direction 774 which is the same as direction 724. The x-offset and y-offset of neighboring shots in set of shots 750 is different than in set of shots 700. As can be seen, the overlap between nearest-neighboring shots is greater in set of shots 750 than in set of shots 700. The shaded region 790 illustrates the overlap between shot 768 and shot 770. The diagonal bisector 792 of overlap region 790 is perpendicular to the direction of the path or track 774. The closer nearest-neighbor shot spacing in set of shots 750 compared to set of shots 700 will cause the LWR of a surface pattern formed from set of shots 750 to be smaller than the LWR of a surface pattern formed from set of shots 700. If the surface is a reticle from which a photomask is made, and the photomask is used in an optical lithographic process using 193 nm light to form a pattern on a substrate such as a silicon wafer, the difference between the pattern on the substrate using a photomask pattern from set of shots 700, and the pattern on the substrate using a photomask pattern from set of shots 750, may or may not be significant, due to the significant corner rounding that 193 nm optical lithography will produce on the substrate. Particle beam simulation may be used to determine the pattern that will be formed on a surface such as a reticle or photomask from, for example, set of shots 700. The particle beam simulation may include numerous effects, including forward scattering, backward scattering, resist diffusion, Coulomb effect, etching, fogging, loading and resist charging. Lithographic simulation may then be used to calculate the pattern that will be formed on a substrate such as a silicon wafer from the photomask containing the particle beam simulated pattern. The maximum permissible LWR on the substrate will determine the maximum permissible LWR on the photomask, which, in turn, can be used to determine the nearest-neighbor shot spacing of the charged particle beam shots, such as set of shots 700 or set of shots 750. In one embodiment, the LWR on the photomask may be maximized.

Multi-pass exposure may also be used to form a pattern on a surface with a reduced CD split. Referring again to set of shots 700, in one embodiment, shot 710, shot 714 and shot 718 may be exposed in a first exposure pass, and shot 712 and shot 716 may be exposed in a second exposure pass. In this example, shots do not overlap within each of the two exposure passes. Use of multi-pass exposure can therefore allow set of shots 700 to be exposed using a charged particle beam writer that prohibits shot overlap within an exposure pass. In this embodiment, the union of shots for any exposure pass differs from the union of shots for all the exposure passes.

The calculations described or referred to in this invention may be accomplished in various ways. Generally, calculations may be accomplished by in-process, pre-process or post-process methods. In-process calculation involves performing a calculation at the time when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is pre-calculating a pattern formed by two overlapping shots in the vicinity of the shot overlap. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

Figure 8:
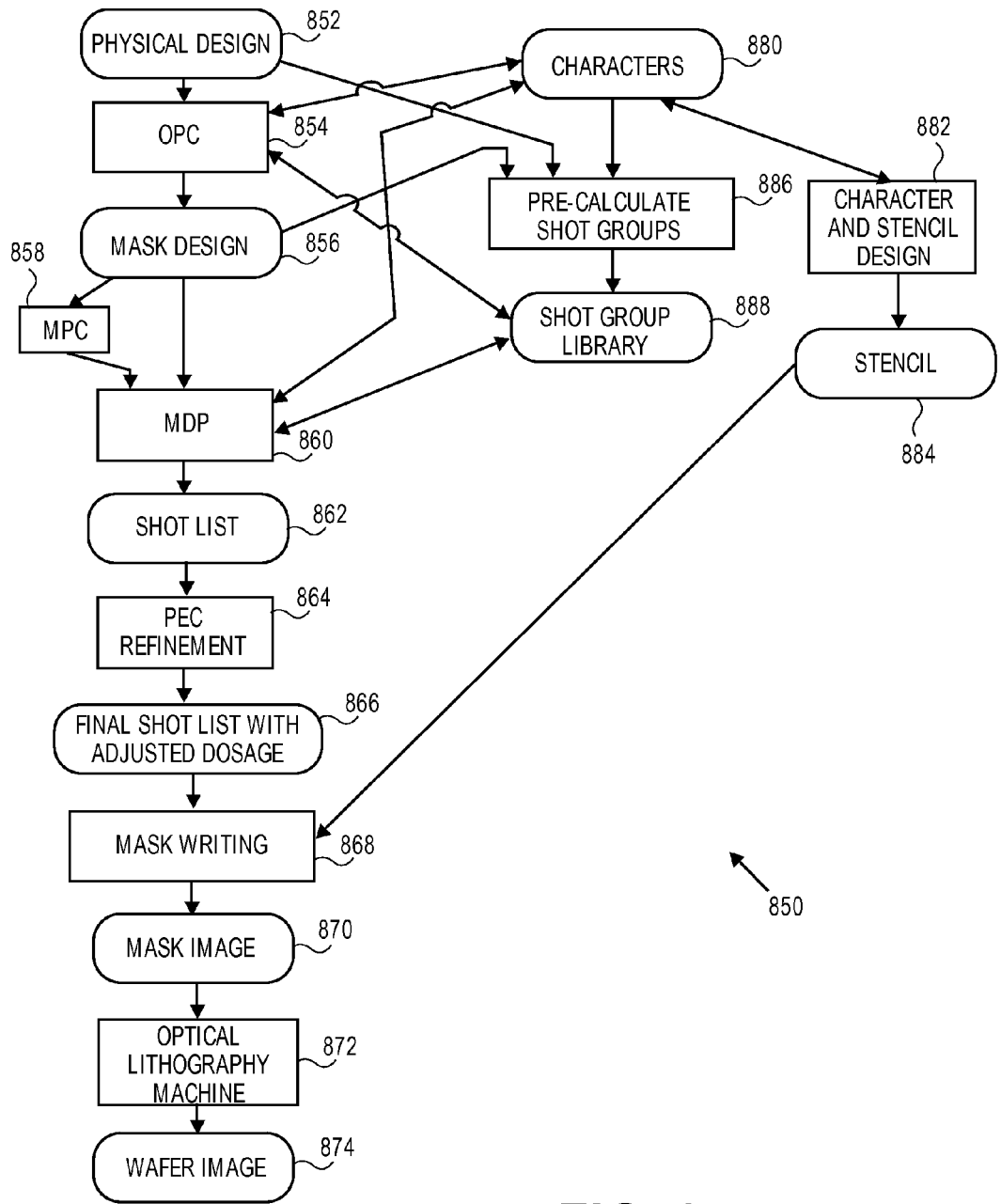
FIG. 8 illustrates a conceptual flow diagram of how to prepare a surface, such as a reticle, for use in fabricating a substrate such as an integrated circuit on a silicon wafer using optical lithography.

FIG. 8 is an exemplary conceptual flow diagram 850 of how to prepare a reticle for use in fabricating a surface such as an integrated circuit on a silicon wafer. In a first step 852, a physical design, such as a physical design of an integrated circuit, is designed. This can include determining the logic gates, transistors, metal layers, and other items that are required to be found in a physical design such as that in an integrated circuit. The physical design may be rectilinear, partially curvilinear, or completely curvilinear. Next, in a step 854, optical proximity correction is determined. In an embodiment of this disclosure this can include taking as input a library of pre-calculated shot groups from a shot group library 888. This can also alternatively, or in addition, include taking as input a library of pre-designed characters 880 including complex characters that are to be available on a stencil 884 in a step 868. In an embodiment of this disclosure, an OPC step 854 may also include simultaneous optimization of shot count or write times, and may also include a fracturing operation, a shot placement operation, a dose assignment operation, or may also include a shot sequence optimization operation or dose margin optimization, or other mask data preparation operations, with some or all of these operations being simultaneous or combined in a single step. The OPC step 854 may create partially or completely curvilinear patterns. The output of the OPC step 854 is a mask design 856.

Mask process correction (MPC) 858 may optionally be performed on the mask design 856. MPC modifies the pattern to be written to the mask so as to compensate for non-linear effects, such as effects associated with patterns smaller than about 100 nm in conventional optical lithographic masks. MPC may also be used to compensate for non-linear effects affecting EUV masks. If MPC 858 is performed, its output becomes the input for mask data preparation (MDP) step 860.

In a step 860, a mask data preparation operation which may include a fracturing operation, a shot placement operation, a dose assignment operation, or a shot sequence optimization may take place. MDP may use as input the mask design 856 or the results of MPC 858. In some embodiments of the present invention, MPC may be performed as part of a fracturing or other MDP operation. Other corrections may also be performed as part of fracturing or other MDP operation, the possible corrections including: forward scattering, resist diffusion, Coulomb effect, etching, backward scattering, fogging, loading, resist charging, and EUV midrange scattering. The result of MDP step 860 is a shot list 862, either for one or for multiple exposure passes in mask writing step 868. Either OPC step 854 or MDP step 860, or a separate program 886 can include pre-calculating one or more shot groups that may be used for a given input pattern, and storing this information in a shot group library 888. Combining OPC and any or all of the various operations of mask data preparation in one step is contemplated in this disclosure. Mask data preparation step 860, which may include a fracturing operation, may also comprise a pattern matching operation to match pre-calculated shot groups to create a mask image 870 that matches closely to the mask design 856. Mask data preparation 860 may also include calculating the dose margin, and may also include optimizing the dose margin. Mask data preparation may also include calculating CD split, and may also include reducing or optimizing CD split. In one embodiment, mask data preparation 860 may include revising the initially-determined set of shots if the calculated dose margin is below a pre-determined target dose margin, and recalculating the dose margin with the revised set of shots. In another embodiment, mask data preparation 860 may include assigning a shot to one of a plurality of exposure passes. Mask data preparation 860 may also comprise inputting patterns to be formed on a surface with the patterns being slightly different, selecting a set of characters to be used to form the number of patterns, the set of characters fitting on a stencil mask, the set of characters possibly including both complex and VSB characters, and the set of characters based on varying character dose or varying character position or applying partial exposure of a character within the set of characters or dragging a character to reduce the shot count or total write time. A set of slightly different patterns on the surface may be designed to produce substantially the same pattern on a substrate. Also, the set of characters may be selected from a predetermined set of characters. In one embodiment of this disclosure, a set of characters available on a stencil in the step 880 that may be selected quickly during the mask writing step 868 may be prepared for a specific mask design. In that embodiment, once the mask data preparation step 860 is completed, a stencil is prepared in the step 884. In another embodiment of this disclosure, a stencil is prepared in the step 884 prior to or simultaneous with the MDP step 860 and may be independent of the particular mask design. In this embodiment, the characters available in the step 880 and the stencil layout are designed in step 882 to output generically for many potential mask designs 856 to incorporate patterns that are likely to be output by a particular OPC program 854 or a particular MDP program 860 or particular types of designs that characterizes the physical design 852 such as memories, flash memories, system on chip designs, or particular process technology being designed to in physical design 852, or a particular cell library used in physical design 852, or any other common characteristics that may form different sets of slightly different patterns in mask design 856. The stencil can include a set of characters, such as a limited number of characters that was determined in the step 860.

In step 864 proximity effect correction (PEC) refinement may be performed on shot list 862 to create a final shot list 866 with adjusted dosages. The final shot list 866 is used to generate a surface in a mask writing step 868, which uses a charged particle beam writer such as an electron beam writer system. In some embodiments, PEC refinement 864 may be performed by the charged particle beam writer. Mask writing step 868 may use stencil 884 containing both VSB apertures and a plurality of complex characters, or may use a stencil comprising only VSB apertures. Mask writing step 868 may comprise a single exposure pass or multiple exposure passes. The electron beam writer system projects a beam of electrons through the stencil onto a surface to form a mask image comprising patterns on a surface, as shown in a step 870. The completed surface may then be used in an optical lithography machine, which is shown in a step 872. Finally, in a step 874, a substrate such as a silicon wafer is produced.

As has been previously described, in step 880 characters may be provided to the OPC step 854 or the MDP step 860. The step 880 also provides characters to a character and stencil design step 882 or to a shot group pre-calculation step 886. The character and stencil design step 882 provides input to the stencil step 884 and to the characters step 880. The shot group pre-calculation step 886 provides information to the shot group library 888. Also, the shot group pre-calculation step 886 may use as input the physical design 852 or the mask design 856, and may pre-calculate one or more shot groups, which are stored in a shot group library 888.

The fracturing, MDP, OPC, MPC and PEC flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for optical proximity correction, fracturing, mask data preparation, mask process correction, and proximity effect correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation or proximity effect correction or optical proximity correction or mask process correction, the method comprising the step of
   determining a plurality of charged particle beam shots,
   wherein the plurality of shots, when exposed using a shaped beam charged particle beam writer, produces a dosage on a resist-coated surface, wherein the dosage on the resist-coated surface forms a pattern comprising a plurality of pattern shapes on the surface,
   wherein the step of determining comprises calculating a critical dimension (CD) split of the plurality of shots, and wherein a pair of shots in the plurality of shots partially overlap, wherein the CD split occurs where opposing edges of a pattern shape are formed primarily by dosage from different shots in the plurality of shots, and wherein the step of determining is performed using a computing hardware processor.

2. The method of claim 1 wherein the plurality of charged particle beam shots comprises a plurality of overlapping circular or nearly-circular character projection (CP) shots.

3. The method of claim 2 wherein the pattern comprises a non-manhattan track of constant or nearly-constant width.

4. The method of claim 3 wherein the track is curvilinear.

5. The method of claim 1 wherein the shaped beam charged particle beam writer comprises a stencil, and wherein all shots in the plurality of charged particle beam shots use a variable shaped beam (VSB) aperture on the stencil.

6. The method of claim 5 wherein all shots in the plurality of shots have the same shape.

7. The method of claim 6 wherein the shape of the shots in the plurality of shots and the overlap between neighboring shots in the plurality of shots is determined so as to minimize CD split.

8. The method of claim 5 wherein shot count is decreased compared to use of only non-overlapping shots.

9. The method of claim 5 wherein the plurality of shots is determined so as to produce a line width roughness (LWR) in the pattern on the surface, wherein the LWR is within a predetermined tolerance.

10. The method of claim 9 wherein shot count is optimized.

11. The method of claim 9 wherein the LWR is maximized.

12. The method of claim 5 wherein the pattern comprises a linear non-manhattan track.

13. The method of claim 12 wherein an area of overlap between a pair of nearest-neighboring shots in the plurality of VSB shots is rectangular, and wherein a diagonal bisector of the rectangular area is perpendicular or nearly perpendicular to the direction of the track.

14. The method of claim 1 wherein the step of determining comprises calculating the pattern that will be formed on the surface by the plurality of charged particle beam shots.

15. The method of claim 14 wherein the calculating of the pattern that will be formed on the surface comprises charged particle beam simulation.

16. The method of claim 15 wherein the charged particle beam simulation includes at least one of a group consisting of forward scattering, backward scattering, resist diffusion, Coulomb effect, etching, fogging, loading and resist charging.

17. The method of claim 1 wherein the plurality of charged particle beam shots comprises a plurality of shots for each of a plurality of exposure passes.

18. The method of claim 17 wherein shots within an exposure pass in the plurality of exposure passes do not overlap.

19. The method of claim 1 wherein the relative position of the different shots varies due to normal manufacturing tolerances characteristic of the shaped beam charged particle beam writer, and wherein a portion of the variance in relative position is orthogonal to at least one of the opposing edges.

20. The method of claim 1 wherein the step of determining further comprises reducing CD variation caused by the CD split.

21. The method of claim 20 wherein the CD variation caused by the CD split is reduced compared to a set of variable shaped beam (VSB) shots that forms the pattern on the surface, wherein no shot in the set of VSB shots overlaps another shot in the set of VSB shots.

22. A system for fracturing or mask data preparation or proximity effect correction or optical proximity correction or mask process correction, the system comprising a device configured to determine a plurality of charged particle beam shots, wherein the plurality of shots, when exposed using a shaped beam charged particle beam writer, produces a dosage on a resist-coated surface, wherein the dosage on the resist-coated surface forms a pattern comprising a plurality of pattern shapes on the surface, wherein a pair of shots in the plurality of shots overlap, and wherein the device determines a reduction in a critical dimension (CD) split of the plurality of charged particle beam shots, wherein the CD split occurs where opposing edges of a pattern shape are formed primarily by dosage from different shots in the plurality of shots.

23. The system of claim 22 wherein the plurality of charged particle beam shots comprises a plurality of overlapping circular or nearly-circular character projection (CP) shots.

24. The system of claim 22 wherein the shaped beam charged particle beam writer comprises a stencil, and wherein all shots in the plurality of charged particle beam shots use a variable shaped beam (VSB) aperture on the stencil.

25. The system of claim 22 wherein the pattern comprises a non-manhattan track.

26. The system of claim 22 wherein the device configured to determine comprises a device configured to calculate the pattern that will be formed on the surface by the plurality of charged particle beam shots.

27. The system of claim 26 wherein the device configured to calculate performs charged particle beam simulation.

* * * * *